(12) United States Patent
Morita

(10) Patent No.: US 7,157,192 B2
(45) Date of Patent: Jan. 2, 2007

(54) METHOD OF MAKING A SEMICONDUCTOR DEVICE MANUFACTURING MASK SUBSTRATE

(75) Inventor: Takeshi Morita, Miyagi (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 11/101,396

(22) Filed: Apr. 8, 2005

(65) Prior Publication Data

US 2005/0287797 A1 Dec. 29, 2005

Related U.S. Application Data

(62) Division of application No. 10/212,165, filed on Aug. 6, 2002, now Pat. No. 6,884,550.

(30) Foreign Application Priority Data

Aug. 21, 2001 (JP) .............................. 2001-250759
Mar. 29, 2002 (JP) .............................. 2002-097163

(51) Int. Cl.
*G03F 1/00* (2006.01)
*G03C 5/00* (2006.01)
(52) U.S. Cl. ......................... 430/5; 430/311; 430/322; 430/323; 378/35
(58) Field of Classification Search ................ 430/5, 430/311, 322, 323; 378/35
See application file for complete search history.

(56) References Cited

U.S. PATENT DOCUMENTS

| 6,099,992 | A | 8/2000 | Motoyama et al. |
| 6,447,960 | B1 | 9/2002 | Yamashita et al. |
| 6,884,550 | B1 * | 4/2005 | Morita .......................... 430/5 |
| 2001/0004122 | A1 | 6/2001 | Ito |

FOREIGN PATENT DOCUMENTS

| JP | 08-160590 | 6/1996 |
| JP | 09-027491 | 1/1997 |
| JP | 09-311432 | 12/1997 |
| JP | 11-307426 | 11/1999 |
| JP | 2000-340568 | 12/2000 |
| JP | 2001-168205 | 6/2001 |

* cited by examiner

Primary Examiner—Geraldine Letscher
(74) Attorney, Agent, or Firm—VolentineFrancos&Whitt,PLLC

(57) ABSTRACT

A method of making a semiconductor device manufacturing mask, which makes it possible to suppress a semiconductor-device global step and simply manufacture a highly reliable semiconductor device. Square dummy patterns each having one side of, for example, 0.25 μm or less are inserted into an area other than an actual pattern lying within a semiconductor device manufacturing mask to thereby uniformize a pattern density, enable etching processing without changing conditions set for every semiconductor device manufacturing mask an prevent an increase in global step of a post-CMP interlayer insulating film.

9 Claims, 6 Drawing Sheets

(a) PATTERN DENSITY (15.74%)

(b) PATTERN DENSITY (5.52%)

(a) PATTERN DENSITY (15.74%)

(b) PATTERN DENSITY (15.09%)

(a)

(b)

METHOD OF MAKING A SEMICONDUCTOR DEVICE MANUFACTURING MASK SUBSTRATE

CROSS REFERENCE TO RELATED APPLICATIONS

This is a divisional application of application Ser. No. 10/212,165, filed Aug. 6, 2002, now U.S. Pat. No. 6,884,550 which is hereby incorporated by reference in its entirety for all purposes.

BACKGROUND OF THE INVENTION

1. Field of the Invention

The present invention relates to a semiconductor device manufacturing mask substrate and a semiconductor device manufacturing method, and particularly to a semiconductor device manufacturing mask substrate for simply manufacturing a semiconductor device which less provides a residual film-thickness difference subsequent to a polishing process of an interlayer insulating film, which occurs due to the difference in pattern density between wiring patterns of the semiconductor device, and a semiconductor device manufacturing method.

2. Description of the Related Art

With high integration of a semiconductor device, densification and multilayering of internal wirings have been put forward in recent years. Light used for exposure, which is used in photolithography, has been advanced in wavelength shortening. When the difference between pattern densities set every semiconductor device manufacturing mask substrates (hereinafter called simply masks) is large in cooperation with lack of a focal depth due to its advance, a problem arises in that etching at wiring fabrication using masks is brought into imperfection and etching conditions must be changed depending on masks to be used. Therefore, when the difference occurs between the pattern densities set every masks, a method of inserting pseudo patterns (also called dummy patterns) except for actual patterns and uniforming etching conditions has been used. Incidentally, the pattern density in the present specification means a ratio of an area for the whole mask to an area in which patterns are laid out within the mask.

As to the pseudo patterns, various techniques have been adopted for how to insert them, according to a pattern form of each mask. As one example of the pattern form of the mask, there is known one which comprises a device section in which patterns for forming thin gate wirings are disposed without a bias, and a TEG (Test Elemental Group) section in which the layout of patterns is biased like insertion of a capacity-measuring large pattern (e.g., a square whose one side is about 100 μm) and the like, and a pattern placement-free area exists. In such a mask, the pseudo patterns are inserted into areas free of the placement of the patterns for the TEG section.

Meanwhile, a high-density plasma CVD (High Density Plasma-Chemical Vapor Deposition: hereinafter called HDP-CVD) oxide film or the like, i.e., an interlayer insulating film is formed over the mask after the formation of the wirings using the mask. The interlayer insulating film varies in deposited-film thickness according to forms of underlying wirings. The interlayer insulating film has a feature that when, for example, local irregularities occur in the surface of the interlayer insulating film depending on irregularities of each underlying thin wiring pattern, and thin wiring patterns are extensively inserted without their bias as in the case of the device section, minus sizing is effected thereon and hence the amount of deposition thereof is reduced, whereas the interlayer insulating film is deposited thick in a large-pattern existing area as in the case of the TEG section. Therefore, a process for flattening the interlayer insulating film is performed by chemical mechanical polishing (hereinafter called CMP) to reduce the irregularities of the surface of the interlayer insulating film and its step.

The flattening of the interlayer insulating film by CMP referred to above is effective for the device section or the like with the thin wirings being placed without their bias, because the local irregularities of the interlayer insulating film are lessened. However, the flattening is not so effective for the TEG section or the like with the large pattern being placed therein, in order to reduce a difference (residual film-thickness difference) between the same section and a portion slow in polishing rate and thin in film thickness as in the case of the device section or the like.

When the residual film-thickness difference (hereinafter called a global step) subsequent to the CMP exists, failures such as a layer-to-layer short, a wiring-to-wiring short or its open, etc. are apt to occur when a material film is further formed on an upper layer, thus leading to reductions in yield and reliability. Therefore, a request for reducing the global step has been made. However, a problem arises in that due to the insertion of the pseudo patterns into the TEG section, further non-uniformity in wiring patterns occurs between the device section and the TEG section, thus increasing the global step.

SUMMARY OF THE INVENTION

In view of the foregoing viewpoint, an object of the present invention is to provide a novel and improved semiconductor device manufacturing mask substrate capable of efficiently manufacturing a semiconductor device which uniformizes a pattern density between masks in such a form as not to increase a post-CMP residual film-thickness and so as to avoid having to change etching conditions every masks, thereby making it possible to efficiently manufacture a semiconductor device having reliability excellent in both performance and durability, and a method of manufacturing the semiconductor device.

According to one aspect of the present invention, there is provided a semiconductor device manufacturing mask substrate comprising a plurality of gate mask patterns formed thereon, an area high in pattern density, an area low in pattern density, and a plurality of pseudo patterns formed on the semiconductor device manufacturing mask substrate corresponding to the area low in pattern density, wherein each of the pseudo patterns comprises a predetermined form having a size less than or equal to a line width of a gate wiring pattern.

According to the above construction, pattern densities can be uniformized among a plurality masks, and an etching process placed under the same conditions is allowed even if different masks are used. Further, pseudo patterns are formed as predetermined forms each having a size less than or equal to a line width of a gate wiring pattern, e.g., squares each having one side of 0.25 μm or less, so that minus sizing is effected on an area (TEG section) corresponding to each pseudo pattern of a semiconductor device, whereby the amount of deposition of an interlayer insulating film in the area can be reduced. Thus, a high-reliable semiconductor device can be manufactured which prevents an increase in residual film thickness in a high-density area of a post-CMP underlying pattern and suppresses an increase in global step inside the semiconductor device.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE PREFERRED EMBODIMENTS

Figure 1:
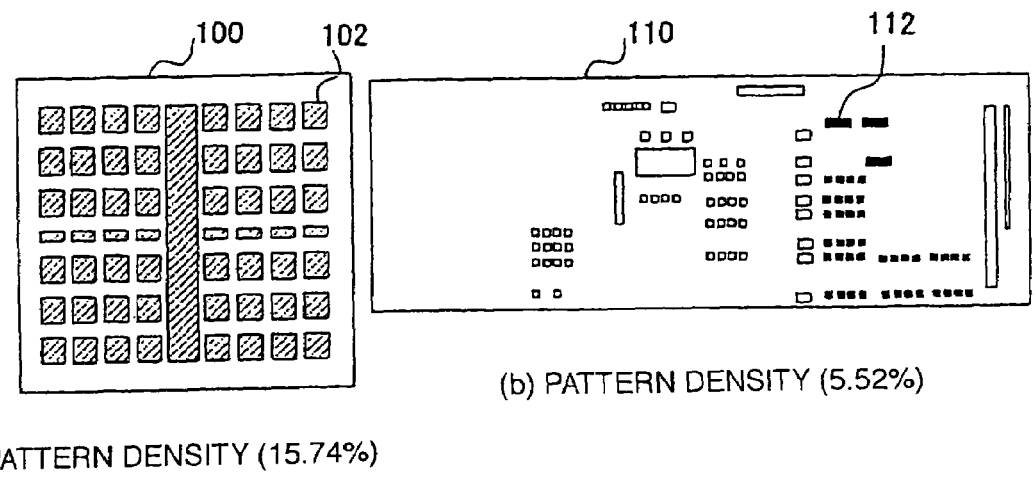
FIG. 1 is a plan simplified diagram showing specific two semiconductor device manufacturing mask substrate 100 and mask 100 in the case of non-insertion of pseudo patterns.

Preferred embodiments of a semiconductor device manufacturing mask substrate and a semiconductor device manufacturing method according to the present invention will hereinafter be described in detail with reference to the accompanying drawings. Incidentally, elements of structure respectively having functional configurations substantially identical to one another in the present specification and the drawings are respectively identified by the same reference numerals, and the description of certain common elements will therefore be omitted.

First Enbodiment

FIG. 1 is a plan simplified diagram showing specific two semiconductor device manufacturing mask substrate 100 and mask 110 where no dummy or pseudo patterns are inserted therein. A gate-electrode fabricating mask will be described here by way of example.

Patterns (hereinafter called actual patterns) 102 for forming actual wirings are placed or laid out on the mask 100 substantially without a bias or deviation. If the ratio of an area of the whole mask to an area in which patterns within the mask are placed, is defined as a pattern density, then it is represented as 15.74% in the case of the mask 100.

On the other hand, the mask 110 has a bias to the placement of the actual patterns. Further, an area for inserting pseudo patterns used to adjust the pattern density exist in the mask 110. The mask 110 has a pattern density of 5.52% with respect to the actual patterns 102.

When no pseudo patterns are inserted in this way, pattern densities are different every masks. Thus, in order to avoid incompletion of etching at the time that the actual patterns are high in density, the need for changing conditions for etching processing at the fabrication of wiring patterns every masks will arise. As a method of avoiding it and uniforming etching conditions, pseudo patterns different from the actual patterns are inserted to uniformize pattern densities set every masks.

Since an interlayer insulating film is grown or deposited over each wiring pattern herein by HDP-CVD or the like in which a deposited-film thickness is affected by the shape of each underlying pattern, it is necessary to insert pseudo patterns having suitable positions and forms.

Figure 2:
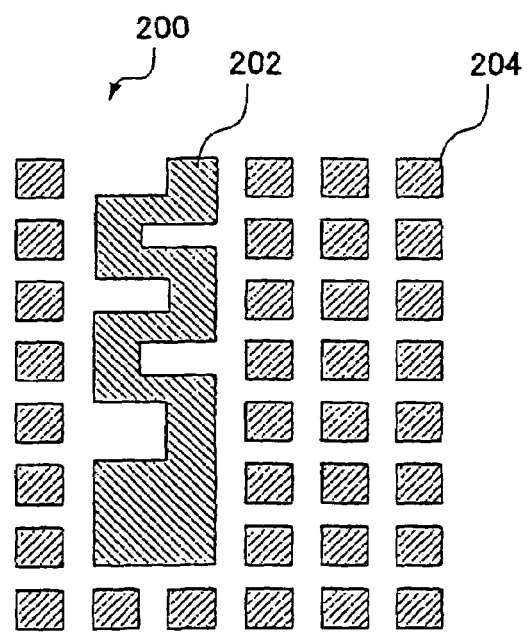
FIG. 2 is a plan view depicting one example illustrative of pseudo patterns according to a first embodiment.

FIG. 2 is a plan view showing one example illustrative of pseudo patterns. As shown in FIG. 2, pseudo patterns 204 are inserted into an area free of the placement of an actual pattern 202 as patterns shaped substantially in the form of squares. The pseudo patterns 204 are ones in which substantially square forms each having, as one side, a length equivalent to about a line width of the actual pattern 202 corresponding to an actual gate wiring pattern are laid out on a discrete basis. In the present embodiment in particular, the substantially square forms are placed in a lattice form.

When the pseudo patterns are laid out in a lattice form as the patterns having the substantially square forms each having, as one side, the length equivalent to about the line width of the actual pattern 202 with the interval between the respective adjacent patterns being left by about the length of one side, minus sizing is effected on an interlayer insulating film in a manner similar to the film deposited on each thin gate wiring pattern when the interlayer insulating film is deposited thereon, thereby causing no thick deposition thereof. Further, the interlayer insulating film on the pseudo patterns is formed in a projected fashion and can be flattened by CMP.

Figure 3:
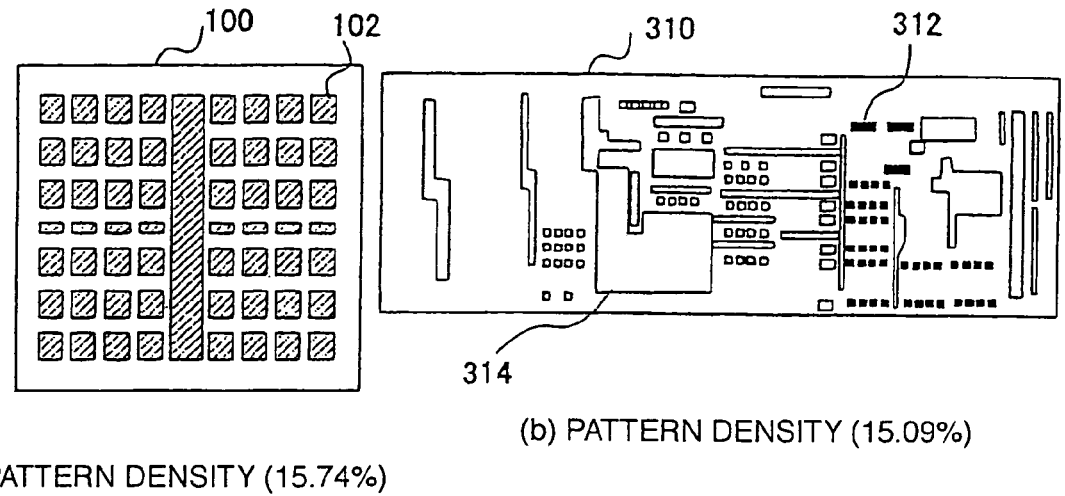
FIG. 3 is a plan simplified diagram illustrating one example of a semiconductor device manufacturing mask substrate according to the first embodiment, which has been adjusted in pattern density.

FIG. 3 is a plan simplified diagram showing one example of a semiconductor device manufacturing mask substrate according to the present embodiment, which has been adjusted in pattern density. As shown in FIG. 3, a mask 310 has a pattern density of about 5% in a manner similar to the mask 110 in the case of actual patterns 312 alone. However, the insertion of pseudo patterns like the pseudo patterns 204 into an area 314 yields a pattern density of 15.09%. Namely, it is possible to provide a pattern density similar to that for the mask 100. Hence patterns densities set every masks can be uniformized.

Figure 4:
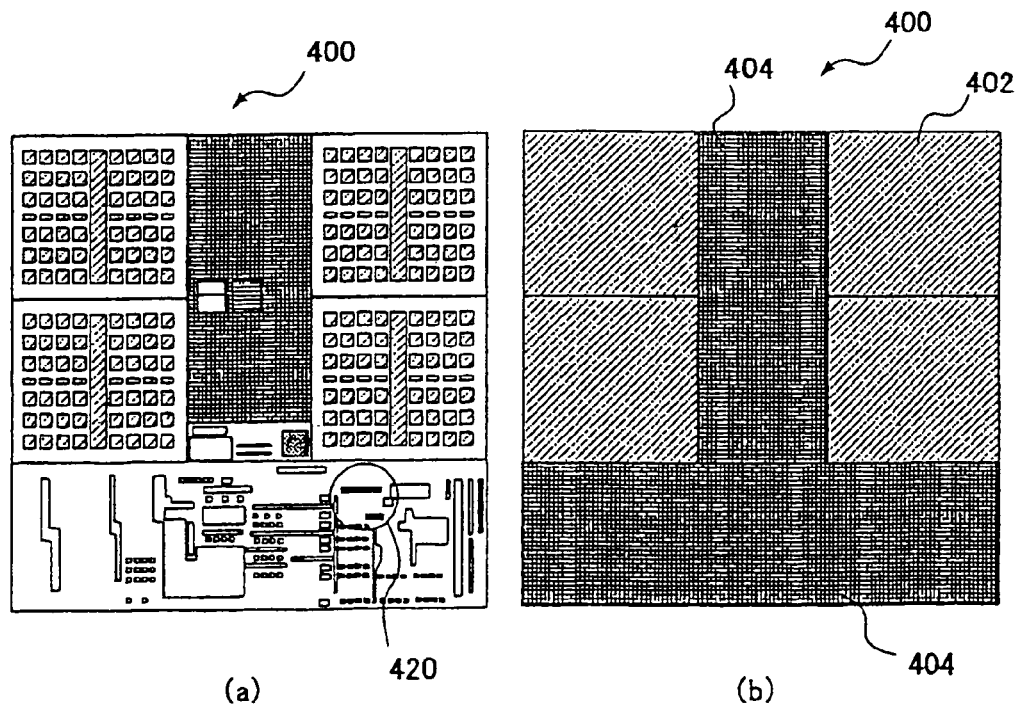
FIG. 4 is a plan simplified diagram showing one example of a conventional semiconductor device manufacturing mask substrate.

The effect of performing a flattening process by CMP will now be explained. FIG. 4 is a flat simplified diagram showing one example of a conventional semiconductor device manufacturing mask substrate, and FIG. 5 is a plan view typically showing a residual film-thickness (corresponding to the distance between the surface of a semiconductor wafer and a film surface) distribution at the time that an HDP-CVD oxide film is deposited, as an interlayer insulating film, on patterns fabricated using a conventional semiconductor device manufacturing mask substrate 400 and thereafter subjected to a CMP process.

As shown in FIG. 4(a), the semiconductor device manufacturing mask substrate 400 has six areas within one shot at its exposure. FIG. 4(b) typically shows their areas. As shown in FIG. 4(b), the six areas of the semiconductor device manufacturing mask substrate 400 can be classified into device sections 402 and a TEG (Test Elemental Group) section 404.

The device sections 402 are respectively patterns used as wiring patterns, which are obtained by disposing thin gate wirings without a bias. The layout of actual patterns is biased for the TEG section 404, like insertion of a capacity-measuring large pattern (e.g., a square whose one side is about 100 μm) and the like, and pattern placement-free areas exist in large numbers.

Figure 5:
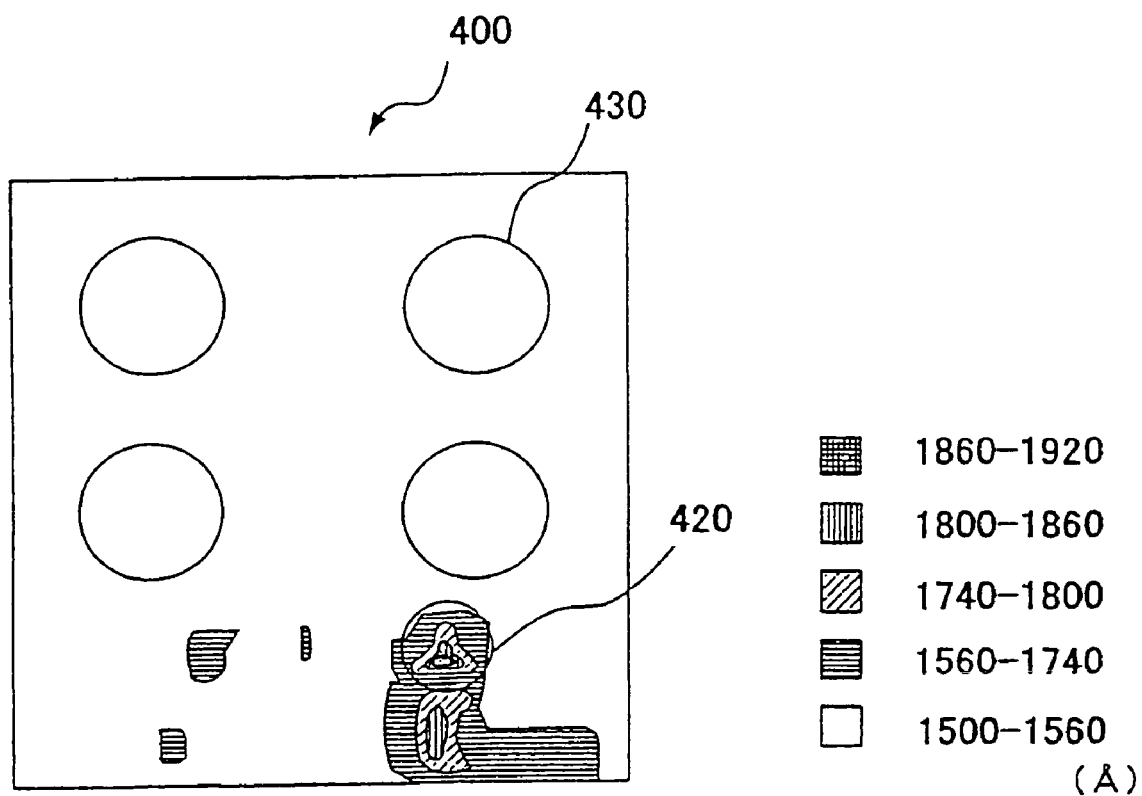
FIG. 5 is a plan view typically illustrating a residual film-thickness distribution subsequent to a CMP process of an HDP-CVD oxide film on patterns formed using the conventional semiconductor device manufacturing mask substrate.

Let's take a look at the residual film-thickness distribution of the post-CMP process HDP-CVD oxide film as shown in FIG. 5. Areas 430 thinnest in residual film-thickness exist in the device sections 402, and an area 420 thickest in film-thickness is formed in the TEG section 404.

Figure 6:
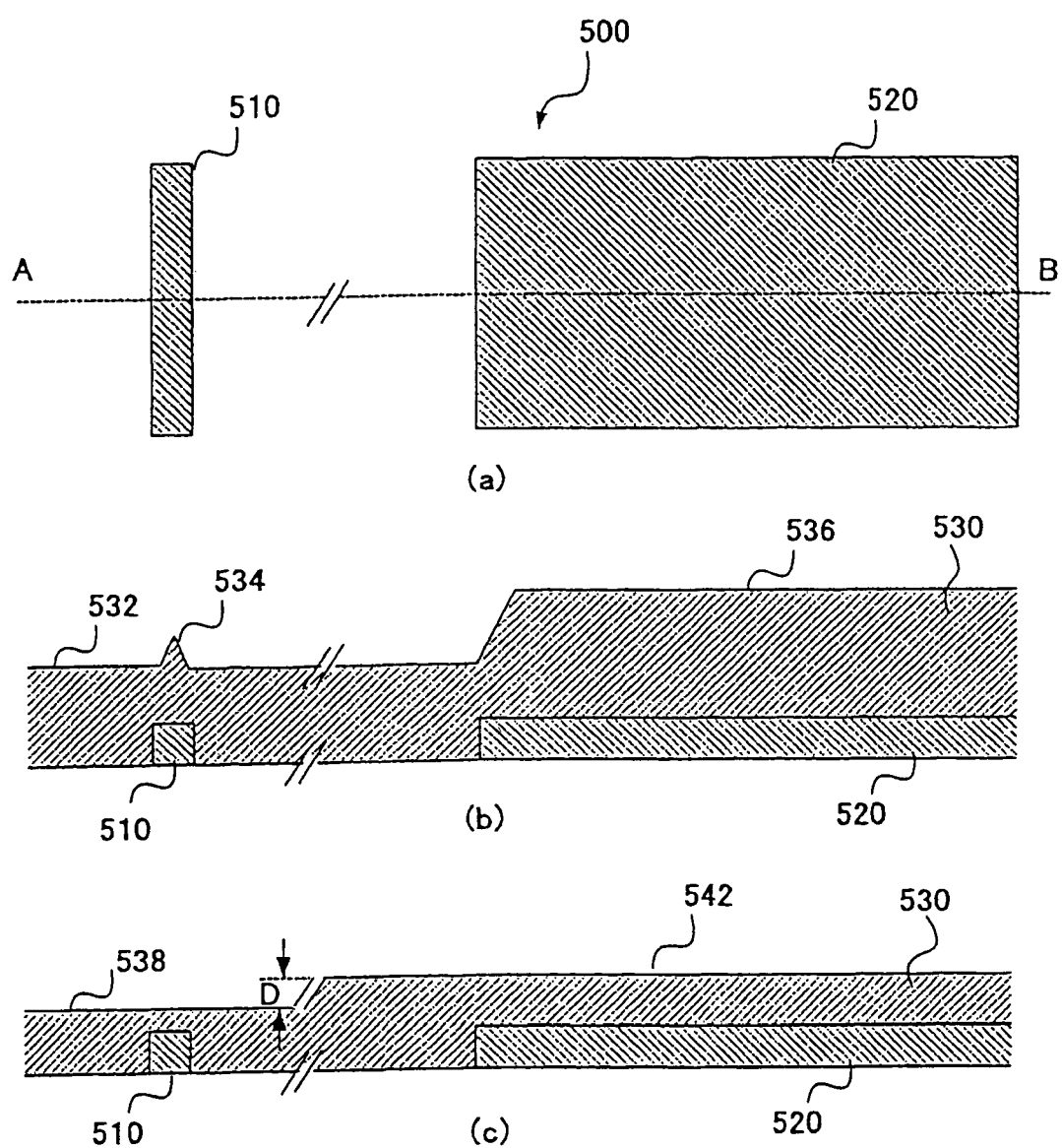
FIG. 6 is a diagram showing underlying dependence at the formation of an HDP-CVD oxide film.

The reason why the difference in residual film-thickness therebetween occurs, will be explained with reference to FIG. 6. FIG. 6 is a diagram showing underlying dependence at the formation of an HDP-CVD oxide film. FIG. 6(*a*) is a plan view of a gate wiring pattern 500, FIG. 6(*b*) is a cross-sectional view taken along line A–B of FIG. 6(*a*) after the HDP-CVD oxide film is deposited on the gate wiring pattern 500, and FIG. 6(*c*) is a cross-sectional view shown after its CMP polishing of FIG. 6(*b*), respectively.

As shown in FIG. 6(*a*), the gate wiring pattern 500 has, for example, a thin gate wiring 510 having a width of 1 μm or less and a large pattern 520 of 100 μm or more. An HDP-CVD oxide film 530 is deposited on the gate wiring pattern 500.

The HDP-CVD oxide film 530 has a feature that minus sizing is effected on a thin gate wiring pattern 510. As shown in FIG. 6(*b*), a surface 532 on the gate wiring pattern 510 is located below a surface 536.

A protrusion 534 is formed over the gate wiring pattern 510. A CMP process for removing the protrusion 534 and surface 536 and a steep step therearound is carried out.

FIG. 6(*c*) shows a post-CMP state. When the CMP process is performed in this way, the protrusion 534 is brought into planar form. While a step developed between the surfaces 532 and 536 is also reduced, the HDP-CVD oxide film on the large pattern is slow in polishing rate, and a step between each of the surfaces and other area is not completely resolved or canceled out. Therefore, a residual film-thickness difference D between surfaces 538 and 542 left behind. This residual film-thickness difference D is called a global step.

Namely, the HDP-CVD oxide film has a feature that when thin wirings like the device sections 402 lie within a wide range, minus sizing is effected thereon so that the amount of deposition thereof decreases. Since the protrusion like the protrusion 534 is removed by CMP, the area 430 thin in residual film-thickness is formed in each device section 402. On the other hand, since a large pattern often exists in the TEG section 404 as in the large pattern 520, a polishing rate of CMP becomes slow and hence the area 420 thick in residual film-thickness is formed.

Thus, in the present embodiment, the pseudo patterns are provided as substantially square-shaped patterns which is free of thick deposition of the interlayer insulating film and each having a length of one side equivalent to about the width of a thin gate wiring, thereby preventing an increase in the residual film-thickness of the pseudo-pattern inserted area.

Thus, according to the semiconductor device manufacturing mask substrate according to the present embodiment, the substantially square-shaped patterns whose each one side is about the line width of the gate wiring pattern, are inserted as the pseudo patterns with at least one interval being left therebetween, whereby different masks can be uniformized in pattern density therebetween, and etching in a high-density area can be prevented from imperfection. It is therefore possible to carry out etching processing under the same conditions even if masks different in the pattern density of each actual pattern are used.

The pseudo patterns are laid out as the square shapes whose each one side has the length equivalent to about the line width of the gate wiring pattern. Further, the interval between the respective adjacent patterns is left by about the line width of each gate wiring pattern in such a manner that the film surface on each pseudo pattern is formed in a protruded fashion upon formation of the interlayer insulating film. It is therefore possible to suppress an increase in the residual film-thickness subsequent to the CMP polishing of the pseudo pattern inserted area and prevent an increase in global step.

Incidentally, the squares that constitute the pseudo patterns according to the present embodiment, can be formed as squares which is free of thick deposition of the HDP-CVD oxide film and whose each one side is about 0.25 μm or less, for example.

Second Embodiment

In a semiconductor device manufacturing mask substrate according to the present embodiment, the pseudo patterns shaped in the form of the squares, according to the first embodiment are taken as rectangular. Since the present embodiment is identical in other configuration to the first embodiment, the description thereof will be omitted.

Since the pseudo patterns according to the first embodiment are small in size, they are inserted into the same mask in large numbers and hence the number of graphics increases as compared with a design data file for the pro-insertion mask. Consequently, an increase in data capacity cannot be avoided. Therefore, a problem that causes inconvenience upon their handling from the practical viewpoint, arises.

Figure 7:
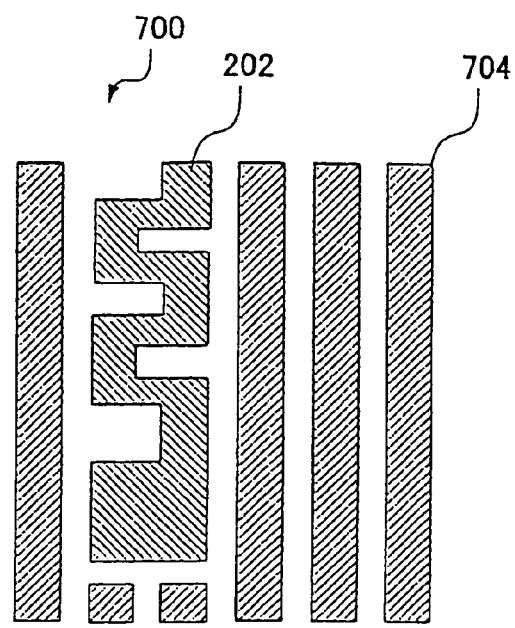
FIG. 7 is a plan view depicting one example illustrative of pseudo patterns according to a second embodiment.

FIG. 7 is a plan view showing one example illustrative of pseudo patterns according to the second embodiment. In the pseudo patterns according to the present embodiment, the forms thereof are respectively are shaped substantially the form of rectangles whose each short side length is given as about the length (e.g., about 0.25 μm or less) of one side of each pseudo pattern according to the first embodiment. These patterns are laid out with an interval substantially equivalent to the first embodiment being left therebetween.

The reason why the length of a long side may be made long, is that a deposited-film thickness of an HDP-CVD oxide film greatly depends on only the short side length of each underlying pattern, and an increase in residual film-thickness due to being affected by the size of the long side is not brought about.

By making the long side length longer than each pseudo pattern according to the first embodiment, e.g., setting it to 0.25 μm or more, the amount of insertion of the pseudo patterns can be reduced and the capacity of a design data file can be reduced. Thus, a high-reliable semiconductor device can be manufactured simpler. Incidentally, all the long side lengths are in no need of being identical.

Third Embodiment

When a semiconductor device manufacturing mask substrate unable to obtain the aimed pattern density takes place or appears even if the pseudo patterns according to the first or second embodiment are inserted, there is a need to change etching conditions as described above. In order to avoid it, pseudo patterns according to the present embodiment need to adjust the interval between the respective adjacent pseudo patterns.

Figure 8:
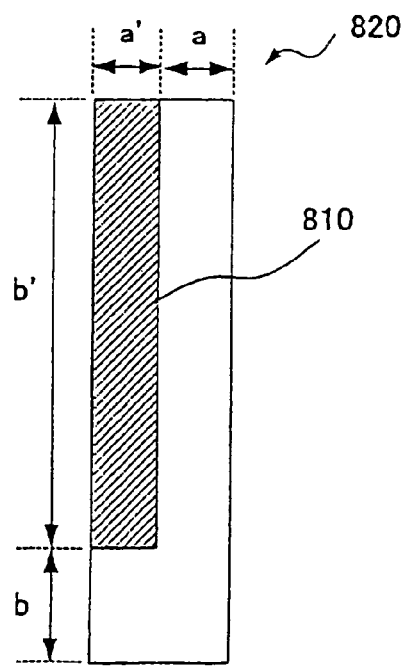
FIG. 8 is a plan view showing a pseudo pattern 820 according to a third embodiment.

FIG. 8 is a plan view showing a pseudo pattern 820 according to the present embodiment. As shown in FIG. 8, the pseudo pattern 820 has a pattern 810 having a short side length of a' and a long side length of b', an interval a formed between the corresponding pattern and an adjacent pattern on the short-side side, and an interval b formed between the corresponding pattern and an adjacent pattern on the long-side side.

Figure 9:
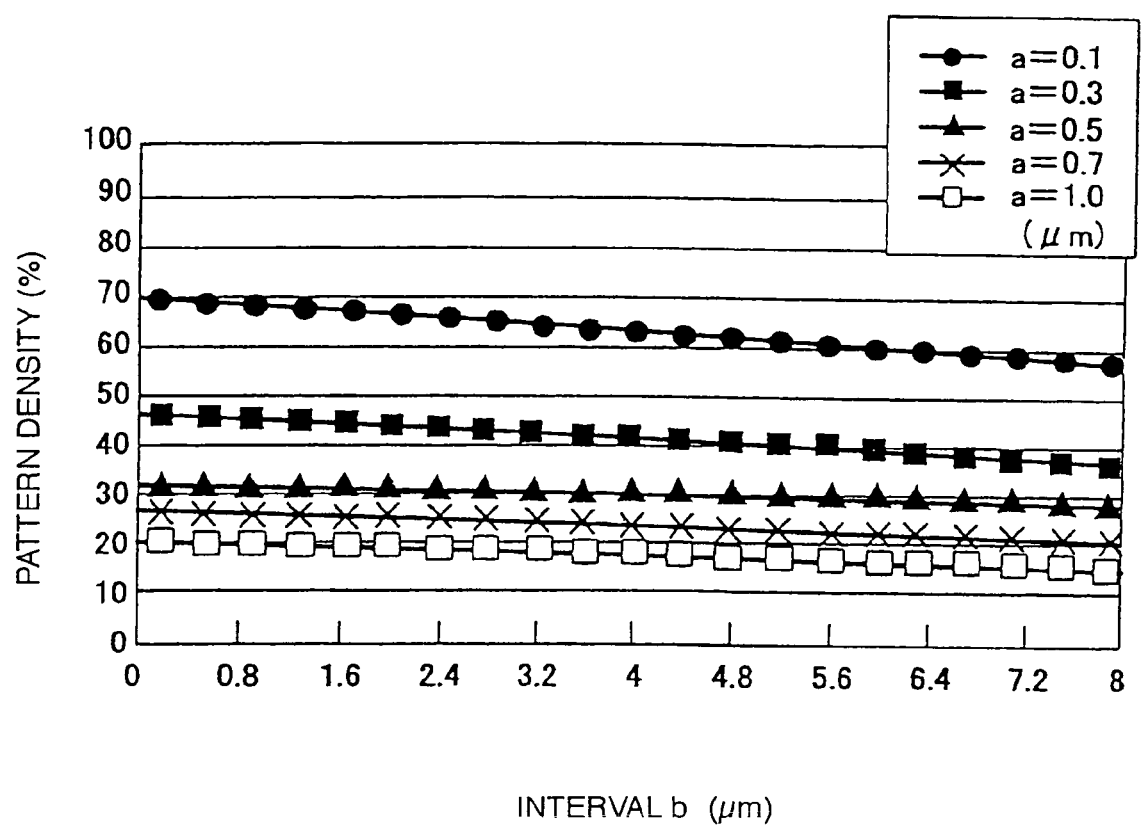
FIG. 9 is a diagram illustrating dependence of pattern densities on intervals a and b.

FIG. 9 is a diagram showing the dependence of a pattern density on intervals a and b. Changing the intervals a and b makes it possible to change the pattern density of a pseudo pattern section as shown in FIG. 9. It is thus possible to make a fine adjustment to a desired pattern density in a semiconductor device manufacturing mask substrate.

Namely, when the pattern density is low even if the pseudo patterns according to the first or second embodiment are inserted, the intervals a and b are narrowed and the pattern density of each pseudo pattern per se is increased. It is thus possible to increase the pattern density of the whole semiconductor device manufacturing mask substrate.

Thus, since the pattern density can be adjusted more accurately, allowance for an on-manufacture margin is made upon uniformization of etching conditions, and a global step is also further suppressed, thereby making it possible to manufacture a semiconductor device which is higher in reliability.

While the semiconductor device manufacturing mask substrate and the semiconductor device manufacturing method according to the present invention have been described above by the preferred embodiments with reference to the accompanying drawings, the present invention is not limited to or by such embodiments. It is apparent to those skilled in the art that various changes or modifications can be supposed to be made to the invention within the scope of a technical idea described in the following claims. It should be understood that those changes and modifications fall within the technical scope of the invention.

While the embodiment of the present invention has been described with the mask for forming the gate electrode wiring pattern as an example, for example, the present invention is not limited to or by it. The invention can be applied even to a metal wiring forming mask upon achieving wiring multilayering and three-dimensioning of a semiconductor device, etc. While the interlayer insulating film has been described with the HDP-CVD oxide film as an example, the present invention is not limited to or by it. One in which a phenomenon similar to the above occur, may also be applied.

According to the present invention as described above, there is provided a semiconductor device manufacturing mask substrate which allows the manufacture of a semiconductor device high in reliability and good in working efficiency, wherein pseudo patterns set to suitable forms, layouts and numbers are inserted in suitable areas of the semiconductor device manufacturing mask substrate, and pattern densities set every masks and between areas on the same mask are uniformized, thereby making it possible to carry out etching processing under the same conditions and suppress a global step to thereby prevent a wiring-to-wiring short, a layer-to-layer short and variations in subsequent etching processing conditions every masks, etc.

Further aspect of the present invention includes a method of manufacturing a semiconductor device, comprising: preparing a semiconductor device manufacturing mask substrate formed with a plurality of gate mask patterns and having an area high in pattern density and an area low in pattern density, said semiconductor device manufacturing mask substrate being formed with a plurality of pseudo patterns in association with the area low in pattern density, and said pseudo patterns respectively comprising predetermined forms each having a size less than or equal to a line width of a gate wiring pattern; forming an interlayer insulating film on wiring patterns formed on a semiconductor substrate, using the semiconductor device manufacturing mask substrate; and flattening the interlayer insulating film by CMP.

The other aspect of the present invention includes the pseudo patterns are respectively squares each having one side of 0.25 µm or less.

The other aspect of the present invention includes the pseudo patterns are respectively rectangles each having a short side of 0.25 µm or less.

The other aspect of the present invention includes the pseudo patterns are disposed in a lattice form.

The other aspect of the present invention includes the interlayer insulating film is formed by a high-density plasma CVD method.

What is claimed is:

1. A method of manufacturing a semiconductor device, comprising:
   preparing a semiconductor device manufacturing mask substrate, the semiconductor device manufacturing mask substrate having a plurality of gate mask patterns formed thereon, an area high in pattern density, an area low in pattern density, and a plurality of pseudo patterns formed on the semiconductor device manufacturing mask substrate corresponding to said area low in pattern density, wherein said pseudo patterns have a predetermined form and a size less than a width of the gate mask pattern; and
   forming wiring patterns on a semiconductor substrate using the semiconductor device manufacturing mask substrate.

2. The method of manufacturing a semiconductor device according to claim 1, the pseudo patterns being respective squares each having one side of 0.25 µm or less.

3. The method of manufacturing a semiconductor device according to claim 1, the pseudo patterns being respective rectangles each having a short side of 0.25 µm or less.

4. The method of manufacturing a semiconductor device according to claim 1, wherein the pseudo patterns are disposed in a lattice form.

5. The method of manufacturing a semiconductor device according to claim 1, wherein an interval between respective adjacent pseudo patterns is about a size less than the line width of the gate mask pattern.

6. The method of manufacturing a semiconductor device according to claim 1, further comprising forming an interlayer insulating film on the wiring patterns formed on the semiconductor device.

7. The method of manufacturing a semiconductor device according to claim 6, wherein the interlayer insulating is formed by high-density plasma-chemical vapor deposition.

8. The method of manufacturing a semiconductor device according to claim 6, further comprising flattening the interlayer insulating film formed on the wiring patterns.

9. The method of manufacturing a semiconductor device according to claim 8, wherein the interlayer insulating film is flattened by chemical mechanical polishing.

* * * * *